United States Patent
Jacobs et al.

(10) Patent No.: US 7,625,780 B2
(45) Date of Patent: Dec. 1, 2009

(54) FLUIDIC HETEROGENEOUS MICROSYSTEMS ASSEMBLY AND PACKAGING

(75) Inventors: Heiko O. Jacobs, Minneapolis, MN (US); Wei Zheng, St. Paul, MN (US)

(73) Assignee: REgents of the University of Minnesota, Minneapolis, MN (US)

( * ) Notice: Subject to any disclaimer, the term of this patent is extended or adjusted under 35 U.S.C. 154(b) by 189 days.

(21) Appl. No.: 11/375,701

(22) Filed: Mar. 14, 2006

(65) Prior Publication Data

US 2006/0223205 A1    Oct. 5, 2006

Related U.S. Application Data

(60) Provisional application No. 60/661,840, filed on Mar. 15, 2005, provisional application No. 60/662,830, filed on Mar. 17, 2005.

(51) Int. Cl.
    *H01L 21/00* (2006.01)
(52) U.S. Cl. .................. 438/116; 438/26; 257/E21.499
(58) Field of Classification Search ................. 438/116, 438/119, 124, 129, 26
    See application file for complete search history.

(56) References Cited

U.S. PATENT DOCUMENTS

| | | | | |
|---|---|---|---|---|
| 5,075,253 A | | 12/1991 | Sliwa, Jr. ..................... 437/209 |
| 5,545,291 A | * | 8/1996 | Smith et al. .................. 438/107 |
| 5,824,186 A | | 10/1998 | Smith et al. .............. 156/655.1 |
| 5,904,545 A | * | 5/1999 | Smith et al. .................. 438/455 |
| 6,780,696 B1 | * | 8/2004 | Schatz ......................... 438/216 |
| 6,962,823 B2 | * | 11/2005 | Empedocles et al. ........... 438/3 |
| 7,151,209 B2 | * | 12/2006 | Empedocles et al. ........ 438/689 |
| 2002/0064909 A1 | * | 5/2002 | Gracias et al. .............. 438/129 |
| 2003/0087533 A1 | * | 5/2003 | Stupp et al. .................. 438/745 |
| 2005/0214952 A1 | * | 9/2005 | Stupp et al. ..................... 438/1 |
| 2005/0282307 A1 | * | 12/2005 | Daniels ........................ 438/82 |
| 2006/0063289 A1 | * | 3/2006 | Negley et al. .................. 438/26 |
| 2006/0191125 A1 | * | 8/2006 | Gracias et al. ............. 29/592.1 |
| 2006/0223205 A1 | | 10/2006 | Jacobs et al. ................... 420/22 |
| 2007/0087469 A1 | * | 4/2007 | Daniels ........................ 438/99 |
| 2007/0215273 A1 | * | 9/2007 | Jacobs ......................... 156/297 |

OTHER PUBLICATIONS

Jacobs, Heiko "Fabrication of a Cylindrical Display by Patterned Assembly" Science vol. 296 Apr. 12, 2002 p. 323-325.*
Onoe, Hiroaki "Three-Dimensional Micro-Self-Assembly Using Hydrophobic Interaction Controlled by Self-Assembled Monolayers" IEEE Journal of Microelectromechanical Systems vol. 13 No. 4, Aug. 2004 p. 603-611.*
Zheng et al. ("Zheng" Zheng, Wei "Sequential shape-and-solder-directed self-assembly of functional Microsystems" PNAS vol. 1. No. 35 Aug. 31, 2004 pp. 12814-12817).*

* cited by examiner

*Primary Examiner*—Evan Pert
*Assistant Examiner*—Grant S Withers
(74) *Attorney, Agent, or Firm*—Westman, Champlin & Kelly, P.A.

(57) ABSTRACT

Self-assembly of components carried in a fluid is provided. A first component and a second component are obtained and self-assembled together. A third component is obtained and assembled with the first and second components, following the step of assembling the first and second components. The first, second and third components are all different types of components.

18 Claims, 2 Drawing Sheets

FLUIDIC HETEROGENEOUS MICROSYSTEMS ASSEMBLY AND PACKAGING

CROSS-REFERENCE TO RELATED APPLICATION

The present application is based on and claims the benefit of U.S. provisional patent application Ser. No. 60/661,840, filed Mar. 15, 2005, and Ser. No. 60/662,830, filed Mar. 17, 2005, the contents of which are hereby incorporated by reference in their entirety.

GOVERNMENT RIGHTS

The United States government has certain rights in this invention pursuant to Agency Grant No. ECS-0300263 awarded by the National Science Foundation.

BACKGROUND OF THE INVENTION

The present invention relates to assembly of devices and systems. More specifically, the present invention relates to self-assembly and related processes and the resultant devices.

Self-assembly refers in general to processes for assembling devices or components in which the assembly takes place without active interaction from an external force. Instead, self-assembly techniques rely on characteristics of individual components that urge the components to assemble together in a desired manner.

Self-assembly techniques are desirable because they can greatly reduce manufacturing costs. Further, they are particularly well suited for assembly of very small components, such as micro and nanometer sized components, in which their extremely small size makes physical and robotic assembly difficult.

Robotic assembly lines are (i) ineffective in assembling components that are smaller than 1 mm in size fundamental challenges appear at <100 µm length scale, as a result, components are connected on a board level not a chip level, and system performance goes down; (ii) are ineffective in assembling components in three dimensions; (iii) are ineffective in forming interconnects between non-planar and three-dimensional structures; (iv) have a limited throughput due to the serial nature of robotic pick and place; and (v) require a large capital investment.

Figure 2:
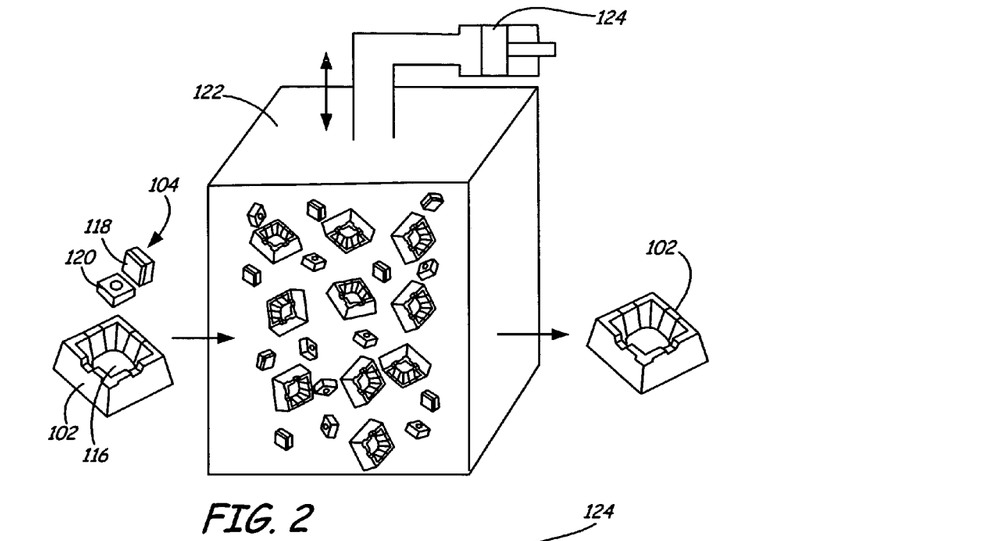
FIG. 2 shows steps in accordance with fabrication of a device of the present invention.

Previous demonstrations of directed self-assembly to generate functional electrical microsystems include the coplanar integration of segmented integrated circuit (IC) devices into 2D "superchips" using capillary forces by Fung and Sliwa (see, C. D. Fung, P. W. Cheung, W. H. Ko, D. G. Fleming, Micromachining and Micropackaging of Transducers (Elsevier, Amsterdam, 1985, 1985) and J. W. Sliwa Jr., in US Patent. (1991), vol. U.S. Pat. No. 5,075,253); shape-directed fluidic methods that position electronic devices on planar surfaces using shape recognition and gravitational forces (see, A. Stemmer, H. Jacobs, H. F. Knapp, Proceedings of the SPIE—The International Society for Optical Engineering 2906, 80-5 (1996); and M. Sitti, H. Hashimoto, Advanced Robotics 13, 417-436 (1999)) by Smith and Yeh (see, H. J. J. Yeh, J. S. Smith, IEEE Photonics Technology Letters 6, 706-708 (1994) and J. S. Smith, H. J. J. Yeh, U.S. Pat. No. 5,824,186 (1998)); liquid-solder-based self-assemblies that use the surface tension between pairs of molten solder drops to assemble three-dimensional electrical networks, ring oscillators, and shift registers (see, C. Baur et al., Nanotechnology 9, 360-364 (1998). And L. T. Hansen, A. Kuhle, A. H. Sorensen, J. Bohr, P. E. Lindelof, Nanotechnology 9, 337-342 (1998).) by Whitesides and Jacobs; capillary force directed self-assembly that uses hydrophobic-hydrophilic surfaces patterns and photo curable polymers to integrate micro-optical components, micromirrors and semiconductor chips on silicon substrates (see, R. Resch et al., Applied Physics a 67, 265-271 (1998); P. E. Sheehan, C. M. Lieber, Nanotechnology 7, 236-240 (1996); P. Kim, C. M. Lieber, Science 286, 2148-2150 (Dec. 10, 1999)) by Boeringer and Howe; and solder-receptor directed self-assembly where metal contacts on segmented semiconductor devices bind to liquid-solder-based-receptors to assemble and electrically connect devices on planar and non-planar surfaces (see, J. Fraysse, A. Minett, O. Jaschinski, C. Journet, S. Roth, Vide-Science Technique et Applications 56, 229-+ (2001)) by Jacobs and Whitesides. The shape-directed method by Smith and Yeh (see, A. Stemmer, H. Jacobs, H. F. Knapp, Proceedings of the SPIE—The International Society for Optical Engineering 2906, 80-5 (1996); and M. Sitti, H. Hashimoto, Advanced Robotics 13, 417-436 (1999)) is used by Alien Technology (www.alientechnology.com) to direct the assembly of small radio frequency identification tags. They flow suspended semiconductor chips over a surface that carries correspondingly-shaped "holes" that act as receptors for the device components. The device components settle into these holes due to gravitational forces. The process by Fung and Sliwa uses segmented integrated circuits that float at an air-liquid or liquid-liquid interface (FIG. 2). The circuit segments are pulled together due to the reduction of the interfacial free energy of the system.

There will be no universal self-assembly strategy that can solve every engineering problem. For example, the processes by Smith and Yeh and Fung and Sliwa allow the formation of two-dimensional assemblies; their extension into three dimensions, however, appears to be impossible. Both strategies do not address the formation of electrical interconnects during the assembly step and require additional processing.

There is an ongoing need to improve self-assembly techniques and expand their functionality.

SUMMARY OF THE INVENTION

A method of self-assembly of components including obtaining a first component and obtaining a second component. The first component type is assembled with the second component type in a fluid bath. A third component is assembling with the first and second components following the step of assembling the first and second components. The first, second and third components are all different types of components.

DETAILED DESCRIPTION OF ILLUSTRATIVE EMBODIMENTS

The present invention provides non-robotic fabrication of packaged Microsystems that contain non-identical parts by a directed self-assembly process. The self-assembly process uses geometrical shape recognition to identify different components and subsequent bond formation between liquid solder and metal-coated areas to form mechanical and electrical connections. The present invention applies this concept of shape recognition and subsequent formation of contacts to assemble and package Microsystems that contained non-identical subunits. The self-assembly of three-component assemblies is provided by sequentially adding device segments to the assembly solution including 200 micrometer sized light-emitting diodes. Six hundred AlGaInP/GaAs light-emitting diode segments were self assembled onto device carriers in 2 minutes without defects. Encapsulation units then were self-assembled onto the LED-carrier assemblies to form a three-dimensional circuit path to operate the final device. The procedure provides a new route to the creation of autonomous heterogeneous Microsystems including the realization of autonomous wireless sensor system that require non-identical units: CMOS circuitry, Non-CMOS sensor unit for sensing, III/V components for communication, and encapsulation units to form 3D electrical interconnects.

Traditional manufacturing technologies that focused on assembly include serial pick-and-place, serial wire-bonding, serial packaging, and parallel wafer-to-wafer transfer (see, M. B. Cohn, K. F. Bohringer, J. M. Noworolski, A. Singh, C. G. Keller, K. Y. Goldberg, and R. T. Howe, "Microassembly technologies for MEMS," *Proceedings of SPIE*, vol. 3512, pp. 2-16, 1998). As components become smaller, following the trend in miniaturization, conventional robotic methods and assembly lines fail because of the difficulty in building machines that can economically manipulate components in three dimensions that are only micrometers in size. Methods of directed self-assembly have the potential to overcome the limitations of robotic assembly and enable multicomponent Microsystems manufacturing in three-dimensions (see, H. J. Yeh and J. S. Smith, "Fluidic self-assembly for the integration of gaas light-emitting diodes on si substrates," *IEEE Photonics Technology Letters*, vol. 6, pp. 706-708, 1994; M. Boncheva, D. H. Gracias, H. O. Jacobs, and G. M. Whitesides, "Biomimetic self-assembly of a functional asymmetrical electronic device," Proc. Natl. Acad. Sci. USA, vol. 99, pp. 4937-4940, 2002; U. Srinivasan, M. A. Helmbrecht, C. Rembe, R. S. Muller, and R. T. Howe, "Fluidic self-assembly of micromirrors onto microactuators using capillary forces," *IEEE Journal of Selected Topics in Quantum Electronics*, vol. 8, pp. 4-11, 2002; K. F. Bohringer, U. Srinivasan, and R. T. Howe, "Modeling of capillary forces and binding sites for fluidic self-assembly," *Technical Digest. MEMS*, pp. 369-74, 2001; J. Fang, K. Wang, and K. F. Bohringer, "Self-assembly of Micro Pumps with High Uniformity in Performance," presented at Solid State Sensor, Actuator, and Microsystems Workshop, Hilton Head Island, S.C., 2004; and H. O. Jacobs, A. R. Tao, A. Schwartz, D. H. Gracias, and G. M. Whitesides, "Fabrication of a Cylindrical Display by Patterned Assembly," *Science*, vol. 296, pp. 323-325, 2002. Previous demonstrations of directed self-assembly to generate functional electrical Microsystems include a fluidic method that position electronic devices on planar surfaces using shape recognition and gravitational forces (see, H. J. Yeh and J. S. Smith, "Fluidic self-assembly for the integration of gaas light-emitting diodes on si substrates," *IEEE Photonics Technology Letters*, vol. 6, pp. 706-708, 1994), liquid-solder based self-assemblies that use the surface-tension between pairs of molten solder drops to assemble three-dimensional electrical networks, ring oscillators, and shift registers (see, M. Boncheva, D. H. Gracias, H. O. Jacobs, and G. M. Whitesides, "Biomimetic self-assembly of a functional asymmetrical electronic device," *Proc. Natl. Acad. Sci. USA*, vol. 99, pp. 4937-4940, 2002), capillary force directed self-assembly that uses hydrophobichydrophilic surfaces patterns and photo curable polymers to integrate micro-optical components, micromiYrors and micropump elements on silicon substrates (see, U. Srinivasan, M. A. Helmbrecht, C. Rembe, R. S. Muller, and R. T. Howe, "Fluidic selfassembly of micromirrors onto microactuators using capillary forces," *IEEE Journal of Selected Topics in Quantum Electronics*, vol. 8, pp. 4-11, 2002; K. F. Bohringer, U. Srinivasan, and R. T. Howe, "Modeling of capillary forces and binding sites for fluidic self-assembly," *Technical Digest. MEMS*, pp. 369-74, 2001; and J. Fang, K. Wang, and K. F. Bohringer, "Self-assembly of Micro Pumps with High Uniformity in Performance," presented at Solid State Sensor, Actuator, and Microsystems Workshop, Hilton Head Island, S.C., 2004), and solder-receptor directed selfassembly where metal contacts on segmented semiconductor devices bind to liquid-solder-based receptors on planar and non-planar surfaces (see, H. O. Jacobs, A. R. Tao, A. Schwartz, D. H. Gracias, and G. M. Whitesides, "Fabrication of a Cylindrical Display by Patterned Assembly," *Science*, vol. 296, pp. 323-325, 2002).

One of the challenges in self-assembly is the realization of heterogeneous systems (see, W. Zheng and H. O. Jacobs, "Shape-and-Solder-Directed Self-Assembly to Package Semiconductor Device Segments," *Applied Physics Letters*, vol. 85, pp. 3635-3537, 2004). While current methods allow the positioning of a large number of identical components in a massively parallel manner, systems that consist of more than one repeating unit are difficult to achieve. For example, in shape-directed fluidic self-assembly, small device components settle by mistake into the holes designed to match the shape of larger components. Similarly, in surface-tension driven self-assembly, the binding sites designed for one component will almost always find an overlap with the receptor for a different component. In general terms, the current procedures provide insufficient power of recognition to correctly assemble heterogeneous systems.

The present invention provides a directed self-assembly process for the fabrication of three-dimensional Microsystems that contain non-identical parts. The self-assembly process uses geometrical shape recognition to identify different components and subsequent bond formation between liquid solder and metal-coated areas to form mechanical and electrical connections. This combination provides a greater flexibility in the design of self-assembling systems with minimum defects. Another new element is the use of sequential self-assembly (see, W. Zheng, P. Buhlmann, and H. O. Jacobs, "Sequential Shape-and-Solder-Directed Selfassembly of Functional Microsystems," *Proc. Natl. Acad. Sci. USA*, vol. 101, pp. 12814-12817, 2004; and W. Zheng, J. Chung, and H. O. Jacobs, "Non-Robotic Fabrication Of Packaged Microsystems By Shape-And-Solder-Directed Self-Assembly," presented at IEEE International Conference on MEMS, 2005). In this example, the techniques are used to assemble and package microsystems that contain 200 μm sized optoelectronic devices. The components are 15 times smaller than those used in current robotic assembly lines (see, M. Walz, "Component Rework: A Small World and Getting Smaller," *Circuits Assembly*, Vol. 1, pp. 32-37, 2003), 40 times smaller than those of previous solder-based self-assemblies (see, M. Boncheva, D. H. Gracias, H. O. Jacobs, and G. M. Whitesides, "Biomimetic self-assembly of a functional asymmetrical electronic device," *Proc. Natl. Acad. Sci. USA*, vol. 99, pp. 4937-4940, 2002), and about the same as those assembled by shape-directed fluidic procedures on planar surfaces (see, H. J. Yeh and J. S. Smith, "Fluidic self-assembly for the integration of gaas light-emitting diodes on si substrates," *IEEE Photonics Technology Letters*, vol. 6, pp. 706-708, 1994). Each microsystem is formed using three non-identical components: a semiconductor device segment, a carrier, and an encapsulation unit. This can be used for three dimensional assemblies, including registration and electrical contact formation, and the establishment of a three-dimensional circuit path that enables surface mount device operation.

As used herein, self-assembly includes a method of integration in which the components spontaneously assemble. The components can be carried, for example, in a solution or gas phase until a stable structure of reduced or minimum energy is reached. Components in self-assembled structures find their appropriate location based on their structural properties, including chemical properties. Self-assembly can be applied to components of any scale. However, self-assembly techniques can be particularly applicable to assembly of nano-and micrometer sized components. Self-assembly is sometimes also referred to as "self organization".

FIGS. 1A-F, 2 and 3 illustrate one embodiment of the present invention related to assembly and packaging of Microsystems. In one general example, the present invention includes three parts, an internal device, a carrier which carries the internal device, and an encapsulation unit which encapsulates the device on the carrier. The assembly is formed by a two step sequence of self-assembly and packaging. First, the device is assembled onto the carrier and then the carrier is encapsulated. In this configuration, each microsystem is formed using at least three components: a semiconductor device segment, a silicon carrier and a Pyrex glass and capsulation unit, each with distinct and complementary three dimensional shapes, circuits, solder patterns and copper metalizations. In this illustration, LEDs are provided as device segments to construct a system which can be easily tested. For example, unpackaged cubic AlGaInP/GaAs LED segments with a side length of 200 µm (TK508DR, Tyntek, Taiwan). The chips have two contacts, a small circular anode on the front and a large square cathode covering the back.

The self-assembly and packaging is a two-step process: (i) chip-on-carrier assembly and (ii) chip-encapsulation. To host, protect, and electrically connect the LEDs, silicon carrier units are fabricated using 280 µm thick <100> silicon wafers (Virginia Semiconductor, Fredericksburg, Va.). Each silicon carrier provided a target site—a 200 µm deep tapered opening—that fits one single LED chip at a time. A binding site is integrated—a 200 µm wide square shaped solder-coated area—in the center of the opening for the attachment of the LED chips. During the first self-assembly step, the surface of the liquid solder wets and binds to the gold-coated cathode on the back side of the LEDs. The minimization of the free surface area of the liquid solder drives the assembly into a stable, aligned position. The solder also provides the electrical connection to operate the device and the mechanical bond required to hold the assembly together.

To protect the assembled LED segments and complete the electrical connections, fabricated encapsulation units can be fabricated out of 500 µm-think Pyrex wafers (Corning 7740, Universitywafer, Boston, Mass.). Each encapsulation unit carries a 200 µm deep tapered opening in the center to recognize the assembled LEDs during the encapsulation process and to distinguish between encapsulation units themselves. Each opening exposed five solder-coated areas to wet and bind to correspondingly-shaped gold-coated areas on the LED and carrier during the second self-assembly step.

Figure 1A:
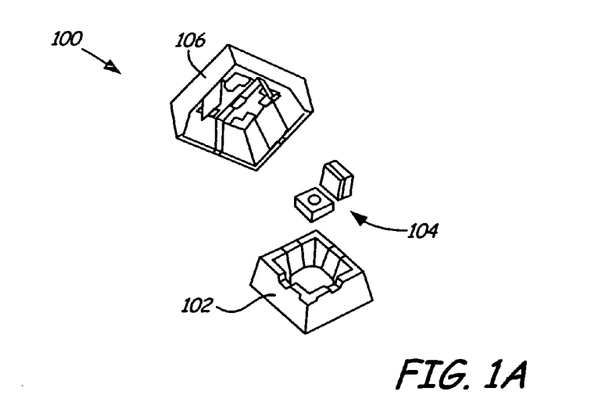
FIG. 1A is an exploded view of one embodiment of the present invention.
Figure 1B:
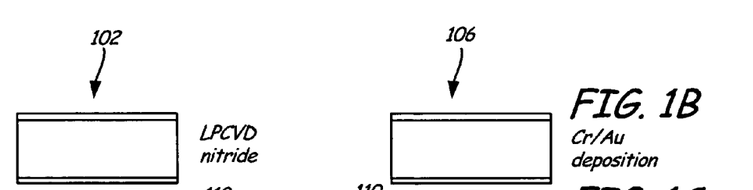
FIGS. 1B, 1C, 1D, 1E and 1F are side cross-sectional views showing fabrication of components illustrated in FIG. 1A.
Figures 1C, 1D:
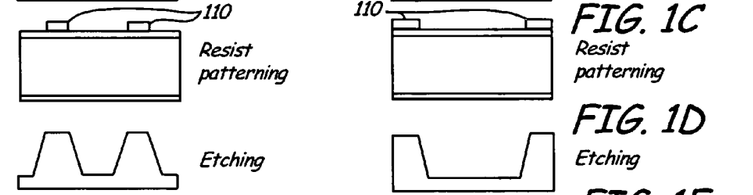
Figures 1E, 1F:
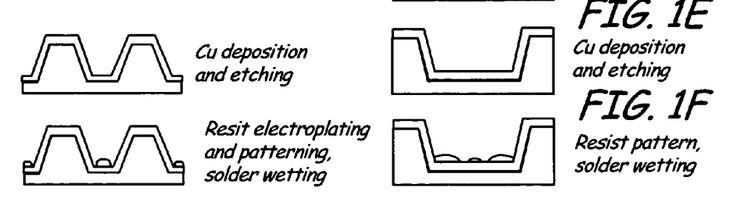

FIG. 1A is an exploded perspective view of a microassembled component 100 including a carrier 102, a device 104 and an encapsulation component 106. Components 102 and 106 include electrical contacts formed therein. FIGS. 1B-1F are side cross-sectional views showing steps in fabricating carrier 102 and encapsulation component 106. In FIG. 1B, substrate are covered with, for example, nitride/au using LPCVD. Next, in FIG. 1C, a resist is deposited and spin coated with a first mask forming resist layers 110. The substrates are etched as illustrated in FIG. 1D and patterned with the second mask for Cu etching. In FIG. 1F, a third mask is used and the components dipped into a solder bath. The carrier can comprise silicon, for example, and includes a tapered opening configured to host a single semiconductor device segment. The encapulsation component 106 includes five solder coated copper areas inside a tapered opening to correspond to contact pads on the device and carrier.

In FIG. 2, the carrier 102, including solder 116 is placed into a bath 122 comprising for example, ethylene glycol at a temperature which is greater than the melting temperature of the solder, for example 100° C. Additionally, the device 104 consisting of an Au/Cu layer 118 and resist layer 120 are placed in the bath 122. The bath is driven by a piston pump 124 to cause the components to come together as illustrated in the right side of FIG. 2. One example solder is Y-LMA-117, mp ~45° C., Small Parts, Miami Lakes, Fla.). The ethylene glycol solution was made slightly acidic (pH ~2.5) with sulfuric acid to remove metal oxide from the surface of the solder drop; an oxide layer-if sufficiently thick-blocks the wetting of the metal surface. Previous solder-based self-assembly systems used a water-based suspension. However, ethylene glycol dissolves less oxygen than water and, therefore, reduces the formation of surface oxide of the liquid solder drastically. Ethylene glycol has a boiling point of 190° C. and allows the operation of electronic devices at elevated temperatures.

The pump 124 provides a turbulent pulsating flow system to provide a strong and reproducible form of agitation. Agitation of the components by shaking the vial manually was also tested; however, the results were less reproducible. The turbulent pulsating flow was created using a piston pump (PM6014, Fluid Metering, Inc., Syosset, N.Y.) that expels and retracts liquid through a 2 mm diameter nozzle that is submerged in the assembly solution. The amount and frequency of liquid that is cycled back and forth an be adjusted between 1-1.5 mL, and 0-10 Hz, respectively. The assembly was carried out inside a rectangular glass container (12 mm on each side and 45 mm high) filled with 4.5 mL of ethylene glycol and immersed in an oil bath that is heated to 150° C.

The energy gain due to the surface-tension S scales with the area $x^2$ of the involved interfaces and is given as $E_s \, Sx^2$ (see, K. S. Birdi, *Self-assembly monolayer structures of lipids and macromolecules at interfaces*. New York: Kluwer Academic/Plenum Publishers, 1999). The disordering energy due to the pulsating flow shows a similar $x^2$ relationship if we consider spherical components; with a diameter x and a pulsating laminar flow of velocity v. The energy change due to flow as a function of the displacement x can then be calculated by integrating Stokes' law and becomes $E_d \, 3 \, vx^2$ where η is the dynamic viscosity of the liquid. The turbulent flow has a number of advantages when compared with tumbling or external acceleration (see, W. Zheng and H. O. Jacobs, "Shape-and-Solder-Directed Self-Assembly to Package Semiconductor Device Segments," *Applied Physics Letters*, vol. 85, pp. 3635-3537, 2004). Good mixing of components with different densities can be accomplished while maintaining an adjustable balance between the disordering and ordering energies for components with different dimensions. The disordering energy due to the drag in a liquid flow and the ordering energy due to surface-tension between components can be adjusted to have similar magnitudes. This may be beneficial in self-assemblies where the level of agitation needs to be adjusted to overcome local energy minima in the space of possible conformations.

Figure 3:
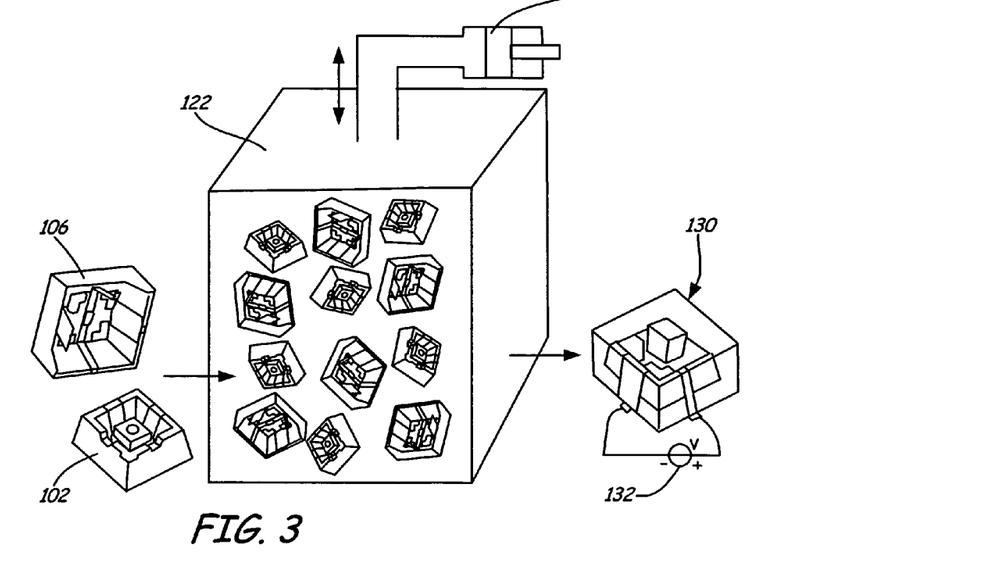
FIG. 3 shows further steps in accordance with fabrication of a device of the present invention.

In FIG. 3, the encapsulation component 106 is added to the bath 122 which assembles with the carrier 102 to form a completed device 130 which is illustrated coupled to a voltage source 132.

In one test, 3000 LED chips and 600 carrier units were added into the heated assembly solution and agitated using the turbulent liquid flow. A yield of 100% was obtained, that is, all 600 carriers had captured an LED device segment in 2 minutes. This experiment was reproduced six times; the yields were always larger than 97%. The assembly speed and yield were influenced by two key parameters: the level of agitation and the number of available excess LEDs. The assembly speed increased with the level of agitation and reached a maximum when extracting and injecting 1.0 mL into the volume at a cycling rate of 3 Hz. A higher level of agitation (5 Hz, 1.0 mL) caused damage to assembled components due to component impaction. The assembly speed also increased with the number of excess LEDs: with 1500 LEDs and 600 carriers in the assembly solution all carriers captured an LED in 6 minutes; with 3000 LEDs it took 2 minutes to complete the self-assembly.

To prepare for the encapsulation process, the excess LEDs were removed by filtration through a 500-µm mesh filter and added 200 encapsulation units to the assembly container. The yield of the encapsulation process was 97%, which means that 3% of the devices did not function as expected. The functionality was tested by surface mounting the devices on a printed circuit board and applying a potential of 2.1 V to the contact pads. The self-encapsulation process was reproduced several times and found that variations in the height of up to ~20 µm, and lateral misfit between the anode of the LEDs and the top electrode of up to ~40 µm, were tolerated; beyond those limits the devices would not function. Small deviations were compensated by the reflow of solder and the repositioning of the LED, carrier, and encapsulation units. Deviations from the permissible range of sizes and positions resulted from variations in the size of the LEDs (~30 µm), and shape, thickness, and location of the solder-coated areas. In some cases solder-based areas on the components was found that were only partially coated with solder, solder-coated areas that dissolved, and components with partially detached metal areas as a source of defects. The overall yield of the process is currently 97% and can be increased by further removing the imperfection in the manufacturing of the components. This summary of defects are not inherent to the self-assembly process itself, but were caused by imperfections in the manufacturing of the components.

Defects integral to self-assembly processes, are most commonly related to local energy minima in the space of possible combinations or to an insufficient overall energy minimum to form a stable assembly under agitation. Local energy minima and associated defects were completely removed by introducing and optimizing the complimentary shapes. First carrier designs, for example, had truncated pyramidal openings that were three times as large as the LED device segments. As a result two device segments assembled on a single receptor. This defect was removed by reducing the size of the opening. The overall energy minima was optimized by changing the size and shape of the solder coated areas and the metallic binding sites on the device components. Early designs for the encapsulation units could not sustain high level of agitations, defects were created by component impaction removing previously assembled LEDs and encapsulation units from the carriers. Fast and stable assemblies were accomplished by increasing the binding sites to cover more than 40% of the surface. The symmetry of the design influences the speed of the self-assembly process as well. The presented design has a four-fold symmetry and assembled faster than designs that presented a two-fold symmetry.

Regarding the fabrication of carrier 102, one example technique involves the use of a p-type 280 µm-thick Si wafer (Virginia Semiconductor, Fredericksburg, Va.) was coated with LPCVD nitride to form a 100 nm thick layer. The substrate was primed with hexamethyldisilazane and spin-coated with photoresist (Microposit 1813, Shipley, Phoenix, Ariz.). After a soft-bake at 105° C. for 1 minute, the substrate was exposed to UV light through a dark field mask. The photoresist was developed in 1 MIF-315: 5 H2O developer for about 15 seconds. The exposed nitride area was etched in STS etcher for 2 minutes; the exposed silicon area was etched in KOH (45%) at 80° C. for 4.5 hours resulting in a 200 µm deep tapered opening. After etching, the silicon wafer was coated with 25 nm Ti and 800 nm copper using e-beam evaporator. Shipley Eagle 2100 photoresist was electroplated on the wafer using a DC voltage (50V) for 30 seconds at 35° C. After a soft-bake at 80° C. for 2 minutes, the substrate was exposed to UV light through the second mask for 60 seconds. The Eagle 2100 photoresist was developed in 1 Eagle 2005 developer: 24 H2O at 38° C. for 2 minutes. The exposed copper was etched in an aqueous ferric chloride solution (1.4 g of FeCl3 per milliliter of H2O, pH 1.3) and the Ti was etched in 10:1 buffered oxide etchant. After removing the Eagle 2100 photoresist in acetone, another layer of Eagle 2100 photoresist was electroplated using a DC voltage (50V) for 30 seconds at 35° C. to form the solder-coated receptors. The photoresist was exposed and developed using the same conditions as described before. The exposed copper squares were coated with solder (Y-LMA-117, mp ~45° C., Small Parts, Miami Lakes, Fla.) by immersing the substrate into a solder bath. Finally, the wafer was diced using an automated dicing saw to obtain the silicon carriers. The remaining photoresist was removed in acetone to expose the binding sites.

One example of the encapsulation component 106 includes use of a 500 µm-thick Corning 7740 wafer (Universitywafer, Boston, Mass.) was coated with 25 nm Cr and 250 nm Au using an e-beam evaporator. The substrate was primed with hexamethyldisilazane, and spin-coated with photoresist (Microposit 1813, Shipley, Phoenix, Ariz.). After a soft-bake at 105° C. for 1 minute, the substrate was exposed to UV light through a dark field mask. The photoresist was developed in MIF-3151:5 developer for about 15 seconds. The metal layers were etched using 4 KI:1 I2:40 H2O for Au and 1 HCl:1 Glycerine:3 H2O for Cr. The exposed glass area was etched in 20 HF (49%):14 NHO3 (69%):66 H2O for 5 hours. After removing the metal layer, the glass wafer was coated with 25 nm Ti and 800 nm copper using an e-beam evaporator. The Shipley Eagle 2100 photoresist was electroplated on the wafer using a DC voltage (50V) for 30 seconds at 35° C. After a soft-bake at 80° C. for 2 minutes, the substrate was exposed to UV light through the second mask for 60 seconds. The Eagle 2100 photoresist was developed in 1 Eagle 2005 developer: 24 H2O at 38° C. for 2 minutes. The exposed copper was etched in an aqueous ferric chloride solution (1.4 g of FeCl3 per milliliter of H2O, pH 0.3) and the Ti was etched in 10:1 buffered oxide etchant. After removing the Eagle 2100 photoresist in acetone, the Shipley 1805 photoresist was spun on the substrate and patterned to expose the copper area for solder wetting. The opening area was coated with the low-melting point solder (Y-LMA-117, mp ~45° C., Small Parts, Miami Lakes, Fla.) by immersing the substrate into a solder bath. Finally, the wafer was diced to obtain the Pyrex encapsulation units. The remaining photoresist was removed in acetone to expose the binding sites.

Preferably, the surface chemistry of the components should be maintained as desired. The surfaces are preferably free from organic contaminations and oxides for the self-assembly process to work. LEDs, silicon carriers and Pyrex encapsulation units can be cleaned in acetone, methanol, and concentrated sulfuric acid before transferring them into the ethylene glycol solution. A small amount of sulfuric acid (pH ~2.5) can be added to dissolve oxides that form in the ethylene glycol solution due to the residual oxygen. It is necessary to adjust the pH carefully to avoid dissolution of the solder itself.

Fabrication strategies that rely on mechanisms of self-assembly are widely recognized as inevitable tools in Nanotechnology. Self-assembly is not limited to the nanometer length scale. Methods of directed self-assembly have the potential to overcome the limitations of robotic assembly and enable multicomponent Microsystems manufacturing in three-dimensions (see, C. D. Fung, P. W. Cheung, W. H. Ko, and D. G. Fleming, Micromachining and Micropackaging of Transducers (Elsevier, Amsterdam, 1985, 1985); J. W. Sliwa Jr., in ZISPatent; Vol. U.S. Pat. No. 5,075,253 (1991); H. J. J. Yeh and J. S. Smith, IEEE Photonics Technology Letters 6, 706-708 (1994); J. S. Smith and H. J. J. Yeh, U.S. Pat. No. 5,824,186 (1998); D. H. Gracias, J. Tien, T. L. Breen, C. Hsu, and E. M. Whitesides, Science 289, 1170-1172 (2000); M. Boncheva, D. H. Gracias, H. O. Jacobs, and G. M. Whitesides, Proceedings of the National Academy of Sciences of the United States of America 99, 4937-4940 (2002); U. Srinivasan, D. Liepmann, and R. T. Howe, Journal of Microelectromechanical Systems 10, 17-24 (2001); U. Srinivasan, M. A. Helmbrecht, C. Rembe, R. S. Muller, and R. T. Howe, IEEE Journal of Selected Topics in Quantum Electronics 8, 4-11 (2002); K. F. Bohringer, U. Srinivasan, and R. T. Howe, Technical Digest. MEMS, 36974(2001); and H. O. Jacobs, A. R. Tao, A. Schwartz, D. H. Gracias, and G. M. Whitesides, Science 296, 323-325 (2002)). Previous demonstrations of directed self-assembly to generate functional electrical microsystems include the coplanar integration of segmented integrated circuit (IC) devices into 2D "superchips" using capillary forces (see, C. D. Fung, P. W. Cheung, W. H. Ko, and D. G. Fleming, Micromachining and Micropackaging of Transducers (Elsevier, Amsterdam, 1985, 1985); and J. W. Sliwa Jr., in ZISPatent; Vol. U.S. Pat. No. 5,075,253 (1991)), shape-directed fluidic methods that position electronic devices on planar surfaces using shape recognition and gravitational forces 3A, liquid-solder based self-assemblies that uses the surface tension between pairs of molten solder drops to assemble three-dimensional electrical network, ring oscillators, and shift registers (see, D. H. Gracias, J. Tien, T. L. Breen, C. Hsu, and E. M. Whitesides, Science 289, 1170-1172 (2000); and M. Boncheva, D. H. Gracias, H. O. Jacobs, and G. M. Whitesides, Proceedings of the National Academy of Sciences of the United States of America 99, 4937-4940 (2002)), capillary force directed self assembly that uses hydrophobic-hydrophilic surfaces patterns and photo curable polymers to integrate micro-optical components, micromirrors and semiconductor chips on silicon substrates (see, U. Srinivasan, D. Liepmann, and R. T. Howe, Journal of Microelectromechanical Systems 10, 17-24 (2001); U. Srinivasan, M. A. Helmbrecht, C. Rembe, R. S. Muller, and R. T. Howe, IEEE Journal of Selected Topics in Quantum Electronics 8, 4-11 (2002); and K. F. Bohringer, U. Srinivasan, and R. T. Howe, Technical Digest. MEMS, 369-74(2001)), and solder-receptor directed self-assembly where metal contacts on segmented semiconductor devices bind to liquid-solder-based-receptors to assemble and electrically connect devices on planar and non-planar surfaces (see, H. O. Jacobs, A. R. Tao, A. Schwartz, D. H. Gracias, and G. M. Whitesides, Science 296, 323-325 (2002)).

In one aspect, the present invention provides directed self-assembly of semiconductor devices by combining three dimensional shape recognition with surface-tension-driven self assembly involving liquid solder. The procedure uses geometrical shape recognition to identify different components and subsequent specific binding to form mechanical and electrical interconnects. Compared with existing self-assembly techniques it provides a high distinguishing power between different components, mechanical strength, and electrical functionality of the assembled system. As used herein, this method is referred to as shape-and-solder directed self-assembly (SSDSA). This concept of shape recognition and subsequent binding between different components can be applied to package semiconductor devices.

For example, LED semiconductor chips were used as device segments—unpackaged AlGaN/GaN LEDs with a chip size 380×330 gm wide, and 80 gm tall (Lginnotek, Korea). To host, protect, and electrically connect the LEDs encapsulation units out of 500 gm-think Pyrex wafers were fabricated (Corning 7740, Universitywafer, Boston, Mass.). To recognize the LEDs during the encapsulation process and to distinguish between encapsulation units themselves complimentary shaped 100 gm deep truncated pyramidal openings were formed in the center of the encapsulation units. Each opening exposed two solder coated areas to wet and bind to correspondingly shaped gold coated areas on the LED. During the self-assembly, the surface of the liquid solder wets and binds to the two gold coated contacts on the front side of the LED segment, and the minimization of the free surface area of the liquid solder drives the assembly into a stable aligned position. The solder also provides the electrical connection required to operate the device and the mechanical bond required to hold the assembly together.

The self-assembly can be performed in DI water at a temperature of 80° C. where the solder is molten. The assembly was carried out inside a rectangular glass container (12 mm on each side and 45 mm high) filled with 4.5 mL of DI water. The solution was made slightly acidic (pH –2.5) with sulfuric acid to remove metal oxide from the surface of the solder drop; an oxide layer-if sufficiently thick-blocked the wetting of the metal surface. A pulsating liquid flow was used to agitate the components. The pulsating flow was delivered using a 30-mm Pasteur pipette by automatic compression of a 1.3-mL bulb using a crankshaft that is driven by a DC motor. The frequency of pulsating liquid can be adjusted between 0 and 4 Hz by changing the motor's rotation speed.

All the components were fabricated by standard micromachining. In brief, the Pyrex wafer was coated with 25 nm Cr and 250 nm Au using an e-beam evaporator. The substrate was spin-coated with photoresist (Microposit 1813, Shipley, Phoenix, Ariz.), exposed, developed, and etched in 4 KI:1 12:40 H2O for Au and 1 HCI:1 Glycerine:3 $H_2O$ for Cr. The tapered opening was formed by etching in 20 BF (49%):14 $NHO_3$ (69%):66 H2O for 2 hours. After removing the metal layer, the glass wafer was coated with 25 nm Ti and 800 nm copper using an e-beam evaporator. Shipley Eagle 2100 photoresist was electroplated on the wafer using a DC voltage (SOV) for 30 seconds at 35° C. After a soft-bake at 80° C. for 2 minutes, the photoresist was exposed and developed. The exposed copper was etched in an aqueous ferric chloride solution (1.4 g of FeCl3 per milliliter of $H_2O$, pH 1.3) and the Ti was etched in 10:1 buffered oxide etchant. After removing the Eagle 2100 photoresist, Shipley 1805 photoresist was spun on the substrate and patterned to expose selected copper areas for solder wetting. The exposed coppPr was coated with a low-melting point solder (Y-LMA-117, mp −45° C., Small Parts, Miami Lakes, Fla.) by immersing the substrate into a solder bath. Finally, the wafer was diced to obtain the Pyrex encapsulation units.

The self-assembly process reached a steady state in 2 minutes. The surface tension along the surface of the liquid solder causes the components to align and seat at the desired location as the solder cools. The assembly process was non-linear. To record the progression of the self-assembly, the assembly process was interrupted to count the number of components that had assembled after 20 second time increments. The progression was faster in the beginning and slowed down with the reduction of available encapsulation units. The packaged devices were separated from the excess LEDs using 500 [tm-mesh filter and assembled onto a printed circuit board in a surface mount device (SMD) configuration. A voltage of 3 V was applied to the printed circuit board to test the functionality of the LEDs and interconnects. The yield of the self-assembly process was 95%, which means that 5% of the devices did not function. This experiment was reproduced 6 times; the yields were always larger than 95%. The defects that were observed included missing and misaligned device segments. These errors were not inherent to the assembly process itself, but were caused by imperfections in both the encapsulation units and the device segments: encapsulation units that were only partially coated with solder, device segments with partially detached metal contacts, and fragments of device segments that assembled into the encapsulation units and that blocked further assembly. In some cases we were able to achieve defect free assemblies by careful visual inspection to select solder-coated encapsulation units that had no defects, and by removing fragments of components from the suspension of components using a 300 gm-mesh filter.

A number of defects can be due to sources other than defective components. Defects integral to self-assembly processes are most commonly related to local energy minima in the space of possible combinations or to an insufficient overall energy minimum to form a stable assembly under agitation. We were able to remove energy minima related defects completely by introducing and optimizing the complimentary shapes. For example, first encapsulation units had large openings and captured one device segment at each solder coated area. These designs could not sustain high level of agitations; defects were created by component impaction removing previously assembled LEDs. We removed these defects completely by reducing the size of the opening, and by increasing the solder coated areas to cover 35% of the bottom face.

The agitation was an important parameter that controlled the mixing and assembly speed. We tested two types of agitation: manual shaking and agitation using a pulsating liquid flow. Hand agitation under a stereomicroscope is suitable to observe the assembly process. However, it becomes increasingly difficult to agitate components with decreasing size since the translational energy scales with the volume of the component and the density difference between the components and the solvent. Furthermore, it was less reproducible. The use of a pulsating flow was a more suitable form of agitation. The drag force in a liquid flow scales with the area of the component and therefore follows the same scaling law than the surface tension. The pulsating flow when compared with external agitation provided an improved mixing and control over the intensity of agitation.

The assembly speed increased with the level of agitation reaching a maximum when injecting and extracting 1.3 mL at a pulsating frequency of 2 Hz. Higher agitations cause damage to assembled components due to component impaction. A second important parameter that influences the time to reach steady state is the number of excess LEDs. Reducing the number of excess LEDs from 1000 to 500 increased the duration of the self-assembly process from 2 minutes to 6 minutes.

This process can be extended to assemble more complex heterogeneous Microsystems. The term heterogeneous Microsystems is used to refer to systems that require integration of components that cross traditional length scales and material boundaries. Heterogeneous systems combine devices that cannot be integrated monolithically. Good examples are miniaturized autonomous sensor systems that contain a number of different parts: CMOS circuitry for processing, Non-CMOS sensor units for sensing, III/V components for communication, and encapsulation units to form 3D electrical interconnects. For example, in an assembly of a system that contains a silicon carrier element with a simple passive circuit, a sensor chip for sensing and amplification, an III/V light emitting diode for optical communication, and a Pyrex encapsulation unit to package and connect the different components. The procedure to fabricate the silicon carriers, Pyrex encapsulation unit, circuits, and patterned solder drops on the three-dimensionally-shaped units is similar to the fabrication steps described above. Each silicon carrier had two differently sized truncated openings with solder coated areas: a 200×200 gm tapered opening to host a single LED chip, and a 600×600 pm tapered opening to host a sensor chip. As sensor chips, P/N photodiode based detector were used with an integrated BJT transistor amplifier (ST0124, Three Five Compounds, New York, N.Y.). The 600×600 pm sized sensor chips assembled onto the silicon carriers during the first self-assembly step. The sensor chips detect and amplify optical radiation in the visible and near infrared spectral range. A second selfassembly step was used to assemble the LEDs onto the silicon carriers. During the third self-assembly step we added encapsulation units to the assembly solution. The encapsulation units protect the assembled components and more importantly complete the electrical connections without the need of a wirebonder. In all steps the minimization of the free surface area of the liquid solder drove the assembly into a stable, aligned position. The functionality of the final structure was tested by hand mounting the assembled sensor modules on a printed circuit board. The self-assembled system is designed to form a transponder: (i) incoming optical radiation is detected by the phototransistor enabling remote activation of the system, (ii) the BJT transistor amplifier amplifies the signal to drive the LED, and (iii) the LED responds back to the remote interrogator. The invention provides self-assembly and packaging of Microsystems using a directed three-dimensional self-assembly technique that combines existing concepts of geometrical shape recognition and site specific wetting and binding involving liquid solder with a new concept of sequential selfassembly. The technique is tailored to enable the realization of heterogeneous three-dimensional microsystems that contain non-identical parts, and of connecting them electrically, where the shape provides the ability to recognize different component, where the solder provides both the driving force, the electrical, and mechanical connections, and where the sequence provides the ability to build complex systems.

The invention is applicable to MEMS technology and in the realization of systems that contain sensors, actuators, or microfluidic elements. Such self-assembly based manufacturing provides advantages in comparison to traditional robotic assembly lines including high-throughput assembly, 3D topologies, and the ability to handle smaller components are the most important advantages. The use of non-conventional lithographic methods where the components can be patterned on all faces provides even greater flexibility in the creation of three-dimensional systems that cannot be fabricated otherwise.

Although the present invention has been described with reference to preferred embodiments, workers skilled in the art will recognize that changes may be made in form and detail without departing from the spirit and scope of the invention.

What is claimed is:

1. A method of self-assembly of components that are detached from a common surface comprising:
   obtaining a plurality of separate and discrete first components;
   obtaining a plurality of separate and discrete second components;
   self-assembling the separate first components to form a plurality of separate and discrete aggregate first components with the separate and discrete second components using shape recognition and surface tension;
   obtaining a plurality of separate and discrete third components;
   self-assembling the separate and discrete third components to form more complex separate aggregates with the separate and discrete first and separate and discrete second components using shape recognition and surface tension following the step of self-assembling the separate and discrete first and separate and discrete second components; and
   wherein the separate and discrete first, separate and discrete second and separate and discrete third components are all different types of components.

2. The method of claim 1 wherein the components are assembled in a fluid.

3. The method of claim 2 including pulsating liquid flow of the fluid to levitate and mix components.

4. The method of claim 2 wherein the boiling point of the fluid is more than about 100° C.

5. The method of claim 2 wherein the fluid comprises a solvent.

6. The method of claim 5 wherein the fluid includes water.

7. The method of claim 1 wherein the separate and discrete first components include solder configured to adhere to the second components.

8. The method of claim 1 wherein the separate and discrete first and separate third components are arranged to enclose the separate second components.

9. The method of claim 1 wherein the separate and discrete first components provide an electrical contact to the separate second components.

10. The method of claim 1 wherein obtaining a separate and discrete first components comprise obtaining a substrate and selectively etching the substrate.

11. The method of claim 10 including depositing a metal layer on the substrate.

12. The method of claim 11 including selectively etching the metal layer.

13. The method of claim 1 wherein self-assembling the separate first components to form a first aggregate with the separate second components includes melting solder.

14. The method of claim 1 wherein self-assembling the separate first components to form a separate first aggregate with the separate second components includes driving a bath with a pump.

15. The method of claim 2 including filtering components in the fluid.

16. The method of claim 1 wherein the separate third components are configured to encapsulate the assembled separate first and separate second components.

17. The method of claim 16 wherein obtaining the separate third components includes obtaining a substrate and etching the substrate.

18. The method of claim 1 wherein the pluralities of separate first, separate second and separate third components are carried in a bath.

* * * * *

UNITED STATES PATENT AND TRADEMARK OFFICE
CERTIFICATE OF CORRECTION

| | | |
|---|---|---|
| PATENT NO. | : 7,625,780 B2 | Page 1 of 1 |
| APPLICATION NO. | : 11/375701 | |
| DATED | : December 1, 2009 | |
| INVENTOR(S) | : Jacobs et al. | |

It is certified that error appears in the above-identified patent and that said Letters Patent is hereby corrected as shown below:

Title Page, item (73) "REgents of the University of Minnesota" should be changed to --Regents of the University of Minnesota--

Signed and Sealed this

Sixteenth Day of March, 2010

David J. Kappos
*Director of the United States Patent and Trademark Office*